United States Patent
Yamashita

[11] Patent Number: 5,982,670
[45] Date of Patent: Nov. 9, 1999

[54] NON-VOLATILE MEMORY DEVICE

[75] Inventor: Minoru Yamashita, Kawasaki, Japan

[73] Assignee: Fujitsu Limited, Kawasaki, Japan

[21] Appl. No.: 09/196,441

[22] Filed: Nov. 20, 1998

[30] Foreign Application Priority Data

Apr. 22, 1998 [JP] Japan .................................. 10-112246

[51] Int. Cl.$^6$ .................................................. G11C 16/04
[52] U.S. Cl. .............................. 365/185.29; 365/185.22; 365/185.24
[58] Field of Search ........................ 365/185.29, 185.22, 365/185.33, 185.24, 185.11

[56] References Cited

U.S. PATENT DOCUMENTS

| | | | |
|---|---|---|---|
| 5,579,262 | 11/1996 | Song .................................. | 365/185.33 |
| 5,646,891 | 7/1997 | Okamoto ............................. | 365/185.22 |
| 5,841,721 | 11/1998 | Kwon et al. ............................ | 365/218 |
| 5,844,842 | 12/1998 | Seki et al. ........................... | 365/185.24 |

*Primary Examiner*—Son Mai
*Attorney, Agent, or Firm*—Nikaido, Marmelstien, Murray & Oram LLP

[57] ABSTRACT

The present invention is a non-volatile memory device, wherein programming or erasing of memory cells is carried out by injecting or removing carriers in floating gates in the memory cells, comprising: a plurality of memory blocks each comprising a plurality of memory cells, respectively; and an erasing circuit for applying an erasing stress in units of the memory blocks and verifying that erasure has been completed in units of memory cells; wherein the erasing circuit applies an erasing stress to the plurality of memory blocks simultaneously until a past erasing stress minimum value for the plurality of memory blocks. According to the aforementioned invention, an erasing stress value, such as a number of erasing stress applications, is recorded for each memory block in past erasing operations, and the minimum erasing stress value of these erasing stress values is recorded. In the next erasing operation, an erasing stress is applied to a plurality of memory blocks in one batch, until this minimum erasing stress value is reached. Therefore, the erasing time can be shortened in comparison with a conventional method where application of erasing stress and erasure verification are repeated for each memory block, after respectively.

8 Claims, 9 Drawing Sheets

NON-VOLATILE MEMORY DEVICE

NON-VOLATILE MEMORY

|  | WL | BL | SL |
|---|---|---|---|
| PROGRAM | HH | HH | L |
| ERASE | NEGATIVE | FLOATING | H |
| READ | H | H | L |

ERASING OPERATION

PRE-PROGRAMMING

ERASING

CHANGE IN NUMBER OF ERASING STRESS APPLICATION

PLURAL MEMORY BLOCKS AND NUMBER OF ERASING STRESS APPLICATION

EN1 < EN2 > EN3 > EN4

(Minimum)

ERASING OPERATION OF FIRST EMBODIMENT

FIG. 7

EXAMPLE OF ERASING OPERATION

| Number of stress | Erasure stress | Erasure verification | Explanation |
|---|---|---|---|
| 1 〜 EN4 | 1, 2, 3, 4 〜 1, 2, 3, 4 | 4 〜 4 | Simultaneous erasure for all blocks<br><br>Reach to minimum EN4 |
| EN4 + 1 | 4 〜 4 | 4 〜 4 | Erase & verify, BL4<br><br>Complte verification for BL4 |
| | 1 〜 1 | 1 〜 1 | Erase & verify, BL1<br><br>Complete verification for BL1 |
| | 2 〜 2 | 2 〜 2 | Erase & verify, BL2<br><br>Complete verification for BL2 |
| | 3 〜 3 | 3 〜 3 | Erase & verify, BL3<br><br>Complete verification for BL3 |

ERASING OPERATION OF SECOND EMBODIMENT

FIG. 9

EXAMPLE OF ERASING OPERATION

| Number of stress | Erasure stress | Erasure verification | Explanation |
|---|---|---|---|
| 1 ⟨ EN4 | 1, 2, 3, 4 ⟨ 1, 2, 3, 4 | 1 ⟨ 1 | Simultaneous erasure for all blocks<br><br>Cancel BLK4 from selection |
| EN4 + 1 ⟨ | 1, 2, 3 ⟨ 1, 2, 3 | 1 ⟨ 1 | Simulateous erasure BL1~3<br><br>Complete verification for BL1<br>Cancel BL1 from selection |
| ⟨ EN3 | 2, 3 ⟨ 2, 3 | 2 ⟨ 2 | Simulateous erasure for BL2, 3<br><br>Cancel BL3 from selection |
| EN3 + 1 ⟨ | 2 ⟨ 2 | 2 ⟨ 2 | Erase & verify, BL2<br><br>Complete verification for BL2 |
| ⟨ | 3 ⟨ 3 | 3 ⟨ 3 | Erase & verify, BL3<br><br>Complete verification for BL3 |
| ⟨ | 4 ⟨ 4 | 4 ⟨ 4 | Erase & verify, BL4<br><br>Complete verification for BL4 |

32.ERASE CIRCUIT

NON-VOLATILE MEMORY DEVICE

BACKGROUND OF THE INVENTION

1. Field of the Invention

The present invention relates to a non-volatile memory device, such as a flash memory, or the like, and more particularly, to a non-volatile memory device whereby over-erasing is prevented and erasing time is shortened.

2. Description of the Related Art

Electrically rewritable non-volatile memory devices, such as a flash memories or EEPROMs, are capable of storing data in an unpowered state, and are widely used in portable telephones, portable information terminals, and the like. Flash memories, in particular, have been developed to high memory capacities, and erasing is carried out in high-capacity memory block units.

A memory cell in a non-volatile memory generally comprises: a control gate connected to a word line; a drain connected to a bit line; and a source connected to a source line. A programming operation (writing data 0) is carried out by applying a high voltage to the control gate and drain so that the memory cell transistor is switched conductive, and by setting the source to a low voltage so as to injecting the electrons passing along the channel to a floating gate. Supplying a prescribed voltage to the memory cell in order to carry out this program operation is known as applying "programming stress". When a program operation is executed, the memory cell transistor has a higher threshold voltage.

Moreover, in the erasing operation, the electrons are drawn away from the floating gate by setting the control gate to a low voltage or negative voltage, setting the drain to a floating state, and setting the source to a high voltage.

This operation of applying a prescribed voltage to the memory cell is known as applying "erasing stress". When an erasing operation is carried out, the memory cell transistor has a low threshold voltage.

In the read-out operation, by controlling the word line to an intermediate voltage between the threshold voltages of the programmed and erased transistors, the memory cell transistors in a programmed state are switched OFF (non-conductive), whilst the memory cell transistors in an erased state are switched ON (conductive), and this presence or absence of current according to the OFF or ON state of the transistors is detected by means of the bit line.

In the erasing operation, after the aforementioned erasing stress has been applied for a prescribed unit time, the memory cell being erased is read out to check (verify) if its threshold voltage is less than the erasure verification level. By repeating the operations of applying this erasing stress and verifying erasure, a suitable erasing operation is performed. In a flash memory using a non-volatile memory, erasing is performed for a whole memory block comprising a plurality of memory cells, in one batch.

In the aforementioned erasing operation, if an erasing stress is applied more times than necessary, the threshold voltage of the memory cell transistors will become negative, meaning that even if the word line is in an unselected state (L level), the memory cell connected thereto will be switched ON, which is undesirable. This state is known as "over-erasing", and must be avoided in the erasing operation.

On the other hand, as memory capacity increases, there is a tendency towards increased variation in the number of applications of, and time period of, erasing stress which is required for each memory cell or each memory block. In general, an erasing operation is carried out by applying an erasing stress to a plurality of memory cells in one batch. Therefore, if erasure has been completed in one portion of the memory cells but it has not been completed in the other memory cells, the erasing stress will still be applied equally to the memory cells which have been completely erased. Consequently, a portion of the memory cells will be "over-erased". The greater the number of memory cells to which an erasing stress is applied in one batch, the greater the variation in the number of erasing stress applications required, and hence the greater the probability of over-erasing.

In order to avoid these-over-erasing problems, conventionally, a memory region is divided into a plurality of memory blocks, and the operations of applying an erasing stress and verifying erasure are repeated for each memory block. By reducing the number of memory cells which are erased in a single operation, it is possible to suppress variation in the threshold voltages of memory cells after application of the erasing stress, thereby avoiding the problems of over-erasing.

However, if a method is adopted whereby the operations of applying erasing stress and verifying erasure are repeated for each memory block, individually, then the time taken to erase all of a plurality of memory blocks will become long. In flash memories, in particular, where high memory capacity is being developed, this lengthening of the erasing time is a problem which must be resolved.

SUMMARY OF THE INVENTION

Therefore, it is an object of the present invention to provide a non-volatile memory device, wherein over-erasing can be prevented whilst erasing time is shortened.

It is a further object of the present invention to provide a non-volatile memory device, wherein there is a low probability of over-erasing due to erasure and a short erasing time, with respect to a large-capacity memory.

In order to achieve the aforementioned objects, the present invention is a non-volatile memory device, wherein programming or erasing of memory cells is carried out by injecting or removing carriers in floating gates in the memory cells, comprising: a plurality of memory blocks each comprising a plurality of memory cells, respectively; and an erasing circuit for applying an erasing stress in units of the memory blocks and verifying that erasure has been completed in units of memory cells; wherein the erasing circuit applies an erasing stress to the plurality of memory blocks simultaneously until a past erasing stress minimum value for the plurality of memory blocks.

According to the aforementioned invention, an erasing stress value, such as a number of erasing stress applications, is recorded for each memory block in past erasing operations, and the minimum erasing stress value of these erasing stress values is recorded. In the next erasing operation, an erasing stress is applied to a plurality of memory blocks in one batch, until this minimum erasing stress value is reached. Therefore, the erasing time can be shortened in comparison with a conventional method where application of erasing stress and erasure verification are repeated for each memory block, after respectively.

Furthermore, in the present invention, after erasing stress is applied to the plurality of memory blocks simultaneously, application of erasing stress and erasure verification are carried out for each memory block individually.

According to the aforementioned invention, since application of erasing stress and erasure verification are repeated for each memory block individually when the threshold voltages of the memory cells approach the erasure verification level, the number of memory cells erased in one batch can be reduced, and hence the probability of over-erasing can be reduced.

BRIEF DESCRIPTION OF THE DRAWINGS

FIG. 7 is a table showing an example of an erasing operation according to the first embodiment;

FIG. 9 is a table showing an example of an erasing operation according to the second embodiment.

DESCRIPTION OF THE PREFERRED EMBODIMENTS

Below, embodiments of the present invention are described with reference to the drawings. However, the technical scope of the present invention is not limited to these embodiments.

Figure 1:
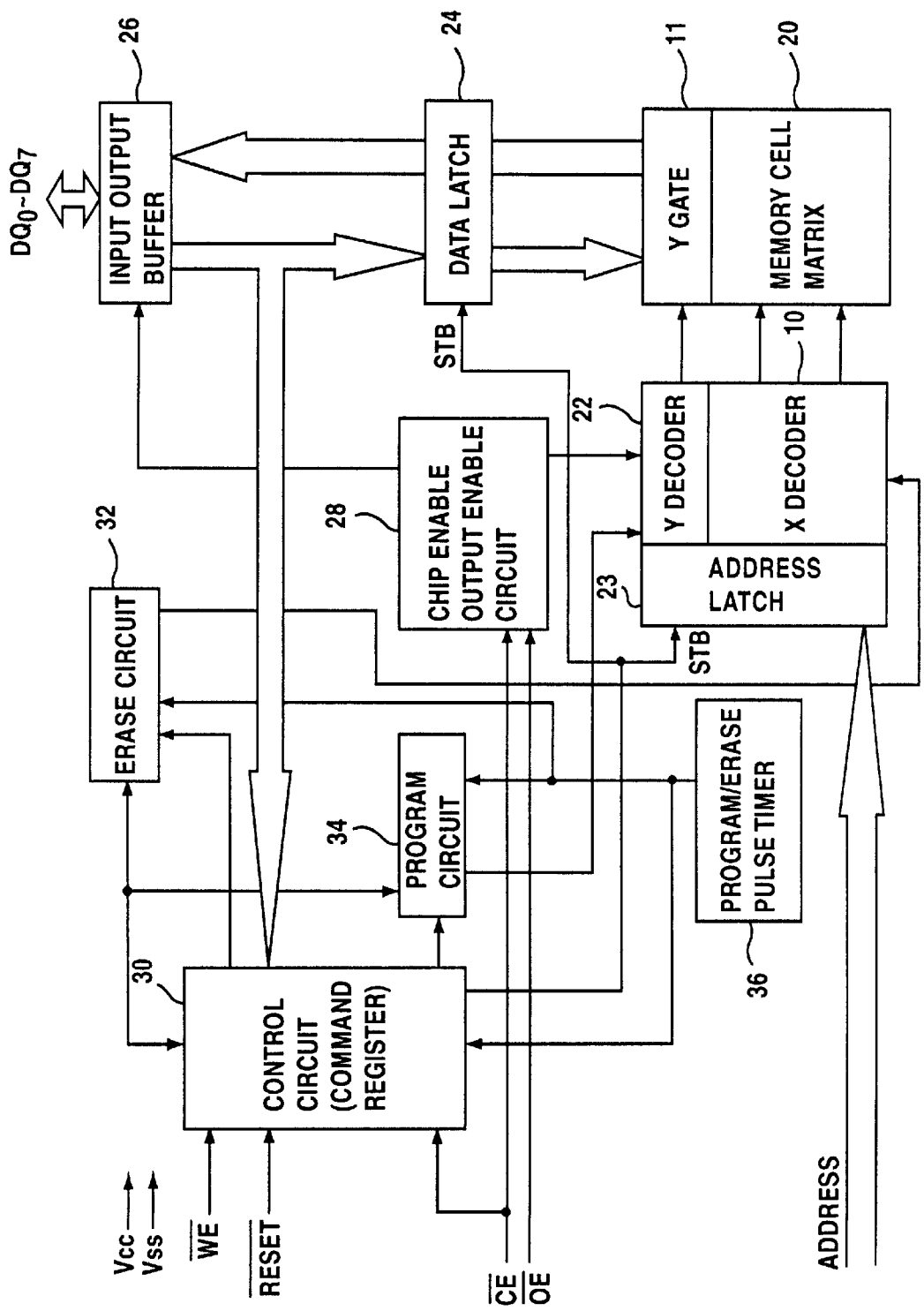
FIG. 1 is a general compositional view of a non-volatile memory device which is the subject of the present invention.

FIG. 1 is a general compositional view of non-volatile memory device. The non-volatile memory device shown in FIG. 1 comprises a matrix region 20 wherein a plurality of memory cells are arranged in a matrix fashion, and a Y gate 11. An X decoder 10 for selecting the word line in the memory cell matrix 20 and a Y decoder for selecting the Y gate 11 are also provided. Addresses from an external source are supplied via an address latch circuit 23 to the X decoder 10 and Y decoder 22. In the memory device in FIG. 1, 8-bit input and output terminals DQ0–DQ7 are connected to an input/output buffer 26. These one-byte unit input/output terminals DQ0–DQ7 are connected to the memory cell matrix region 20 by means of the input/output buffer 26 and a data latch circuit 24. The aforementioned input/output buffer 26 is controlled by a chip enable/output enable circuit 28.

A write enable signal /WE, reset signal /RESET, and chip enable signal /CE, are supplied as control signals from an external source to a control circuit 30 formed by a command register. The control circuit 30 controls internal write operations (programming operations), erasing operations and reading operations through a combination of these control signals.

One feature of the non-volatile memory device is that prescribed voltages are applied respectively to the word line, bit line and source line, in the programming operation and erasing operation. Therefore, a programming circuit 34, erasing circuit 32 and programming/erasing pulse timer 36 are provided in the memory device.

In the programming operation, the control circuit 30 controls the programming circuit 34 such that it generates a prescribed writing voltage. Furthermore, in the erasing operation, the control circuit 30 controls the erasing circuit 32 such that it generates a prescribed erasing voltage. The programming/erasing pulse timer 36 is provided in order to control the programming stress application time during programming and the erasing stress application time during erasing.

Figure 2:
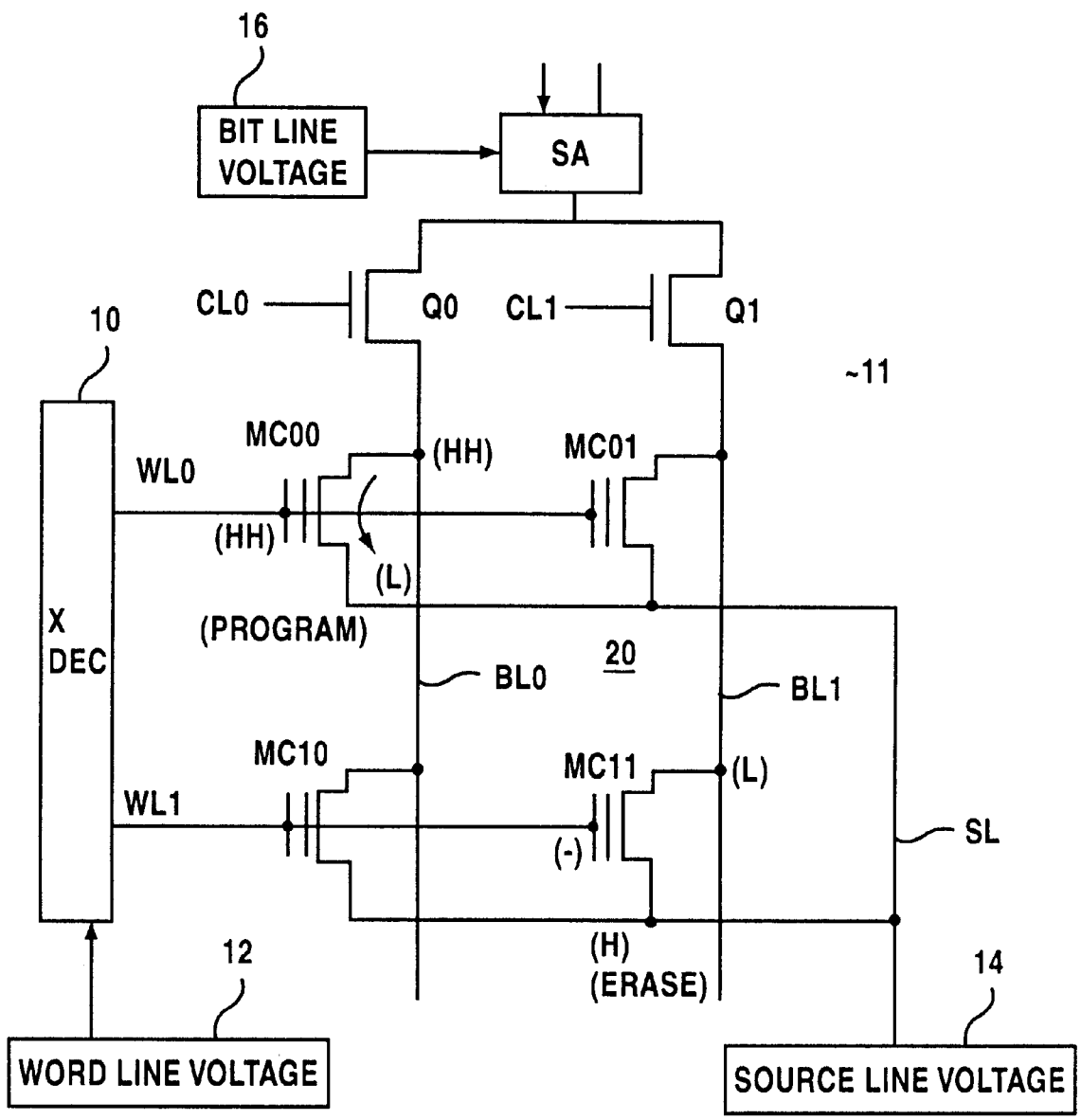
FIG. 2 is a circuit diagram of a general non-volatile memory which is the subject of the present invention.

FIG. 2 is a circuit diagram of a non-volatile memory. FIG. 2 depicts a memory cell matrix region 20, sense amp SA, which is a portion of the data latch circuit, and X decoder 10 and Y gate 11. A word line voltage circuit 12, bit line voltage circuit 16 and a source voltage circuit 14 are also shown, and these voltage circuits correspond to voltage generating circuits in the programming circuit and erasing circuit in FIG. 1.

In FIG. 2, a total of four memory cells MC00, MC01, MC10, MC11 in a two-row, two-column configuration are shown in the memory cell matrix region 20. Each memory cell comprises a control gate, floating gate, source and drain. The control gates of each memory cell are connected respectively to word lines WL0, WL1 arranged in the row direction. The drains of the memory cells are connected respectively to bit lines BL0, BL1 arranged in the column direction. The sources of all the memory cells in the memory cell matrix 20 are connected jointly to a source line SL. The bit lines BL0, BL1 are connected respectively to the sense amp SA by means of gate transistors Q0, Q1 constituting the Y decoder 11. These gate transistors Q0, Q1 are switched ON and OFF by column selection signals CL0, CL1 from the Y decoder, which are omitted from the drawings.

The programming, erasing and reading operations relating to this non-volatile memory are carried out by applying prescribed voltages to the word line WL, bit line BL, and source line SL, as illustrated in the table in the lower portion of FIG. 2. Here, it shall be assumed that memory cell MC00 is being programmed. In this case, the word line WL0 is supplied with a high voltage (HH level), the bit line BL0, with a high voltage (HH level), and the source line SL, with a low voltage (L level), respectively. Consequently, the transistor in memory cell MC00 is switched ON (conductive), and the electrons passing through the channel region are injected into the floating gate by the electric field formed between the control gate and source region. As a result, the threshold voltage of the memory cell MC00 rises.

Next, if it is supposed that memory cell MC11 is to be erased, a negative voltage is applied to the word line WL1, bit line BL1 is set to a floating state, and a high voltage (H level) is applied again to the source line SL. Consequently, an electric field is applied between the control gate and source region in an opposite direction to that during programming, thereby removing the electrons in the floating gate. As a result, the threshold voltage of the memory cell MC11 becomes low. Here, a negative voltage is applied simultaneously to the word line WL0 and the memory cells MC00, MC01 and MC10 are all erased simultaneously.

Figure 3A:
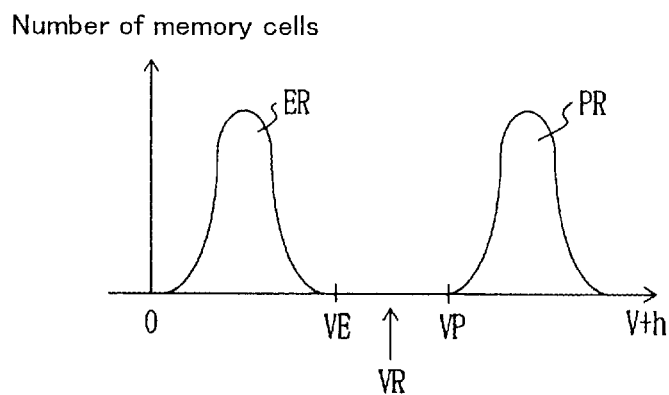
FIGS. 3A, 3B and 3C are diagrams giving approximate illustrations of an erasing operation.
Figure 3B:
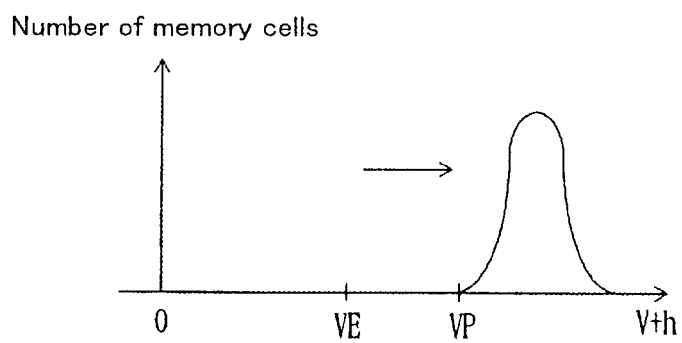
Figure 3C:
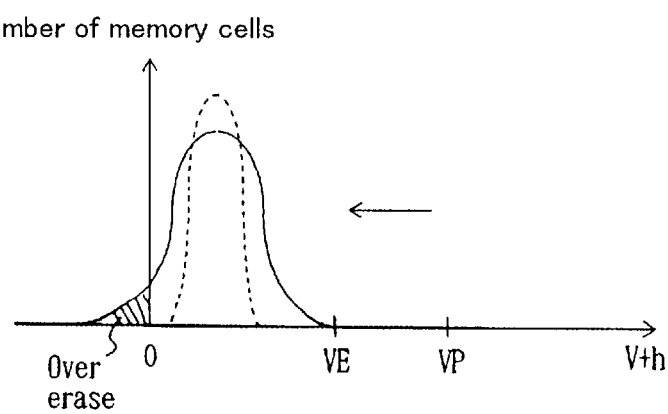

FIGS. 3A, 3B and 3C give approximate illustrations of an erasing operation. FIG. 3A shows the threshold voltage Vth of the memory cell on the horizontal axis and the number of memory cells on the vertical axis, and it illustrates the distribution in a case where a portion of the memory cells in the memory cell matrix are in a programmed state, and the remaining memory cells are in an erased state. Memory cells in a programmed state are located within distribution PR and the threshold voltage of each memory cell is higher than the program verification level VP. On the other hand, memory cells in an erased state are located within distribution ER, and the threshold voltage of these memory cells is lower than the erase verification level VE. During read out, by controlling the word line to the read-out level VR, memory cells in a programmed state are switched OFF (non-conductive), and memory cells in an erased state are switched ON (conductive). This presence or absence of current is detected by the sense amp SA via the Y gate 11.

The erasing of the non-volatile memory is carried out for a plurality of memory cells in one batch. This general erasing operation is carried out as described below. Firstly, as shown in FIG. 3B, data 0 is programmed into all the memory cells. In other words, pre-programming is carried out. Consequently, as shown in FIG. 3B, the threshold voltages for all memory cells are higher than the program verification level VP. Thereupon, the aforementioned erasing stress is applied to a plurality of memory cells in one batch. After the erasing stress has been applied for a unit time, erasure verification is carried out in order to check whether or not the threshold voltages of the memory cells are lower than the erasure verification level. If not all of the memory cells pass this erasure verification, then the erasing stress is applied once again to all of the memory cells. In this way, the operations of applying erasing stress and verifying erasure are repeated, and application of the erasing stress is repeated until the threshold voltages for all memory cells are lower than the erasure verification level VE. As a result, as shown in FIG. 3C, the threshold voltage for all memory cells becomes lower than the erasure verification level VE.

Here, if the number of memory cells to which the erasing stress is applied in one batch is high, then there will be a large variation in the threshold voltages of the memory cells once the erasing operation is completed, as illustrated by the solid line in FIG. 3C, and a portion of the memory cells (shown by diagonal hatching) will have assumed a negative threshold voltage and be in an over-erased state.

If the threshold voltage of a memory cell becomes negative, a proper read-out operation cannot be carried out. For example, in FIG. 2, memory cell MC01 is in an erased state (data 1), and the memory cell MC11 is in an over-erased state. If the word line WL0 is raised to a read-out level and it is sought to read out the data 1 in the memory cell MC01, the memory cell MC01 which itself has a high threshold voltage will be in an OFF state, and no current will flow on the bit line. However, memory cell MC11, which is in an over-erased state, will turn ON, regardless of the non-selected level (L level) of the word line WL1, and current will end up flowing to bit line BL1. Consequently, the sense amp SA will mistakenly detect that memory cell MC01 is in an erased state (data 1).

In this manner, in an erasing operation for a non-volatile memory, it is necessary that the threshold voltage for that memory cell becomes lower than the erasure verification level VE, without becoming negative. Conventionally, in order to lower the probability of over-erasing, the unit to which an erasing stress is applied in one batch is set as a memory block unit, thereby reducing the variation in threshold voltage between the memory cells, as illustrated by the broken line in FIG. 3C.

Figure 4:
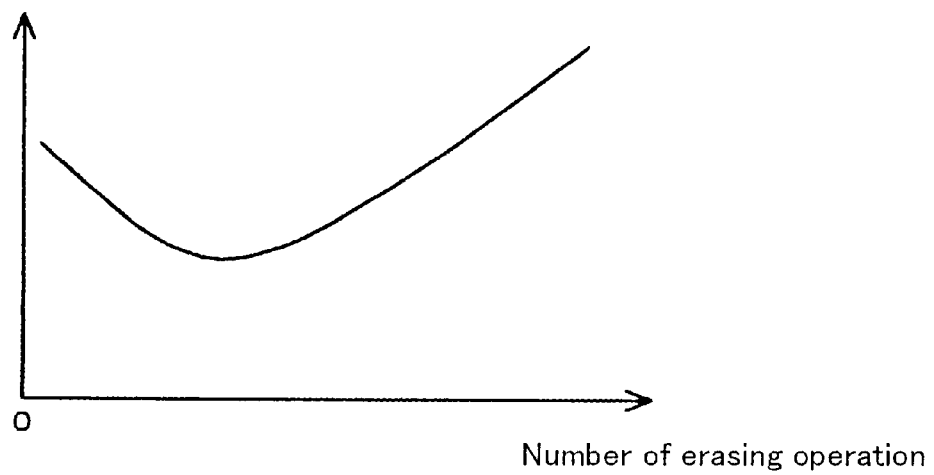
FIG. 4 is a diagram illustrating change in the number of erasing stress operations.

FIG. 4 is a diagram illustrating change in the number of erasing stress applications. In FIG. 4, the horizontal axis shows the number of erasing operations and the vertical axis shows the number of stress applications (stress value) required for erasure. The general trend of change in the number of stress applications required to erase a non-volatile memory is illustrated. As shown in FIG. 4, in the initial stage, as the number of erasing operations increases, the number of stress applications required for erasure falls, and then as the number of erasing operations increases further, the number of stress applications required for erasure rises. Thus, the number of erasing stress applications required to erase a non-volatile memory changes progressively with increase in the number of erasing operations.

Next, an erasing operation relating to an embodiment of the present invention is described. In this embodiment, similarly to the prior art, the erasing circuit is capable of applying an erasing stress for each one of a plurality of divided memory blocks. Also similarly to the prior art, erasure verification is carried out for each memory cell, individually. In the present embodiment, in an erasing operation, initially, an erasing stress is applied simultaneously to a plurality of memory blocks. The number of times that an erasing stress is applied simultaneously in this manner is the minimum number of erasing stress applications out of the numbers of erasing stress applications required respectively for each of the plurality of memory blocks. Thereupon, the operations of applying an erasing stress and verifying erasure are repeated for each memory block, individually. Alternatively, an erasing stress is applied to a plurality of memory blocks simultaneously, as appropriate.

Figure 5:
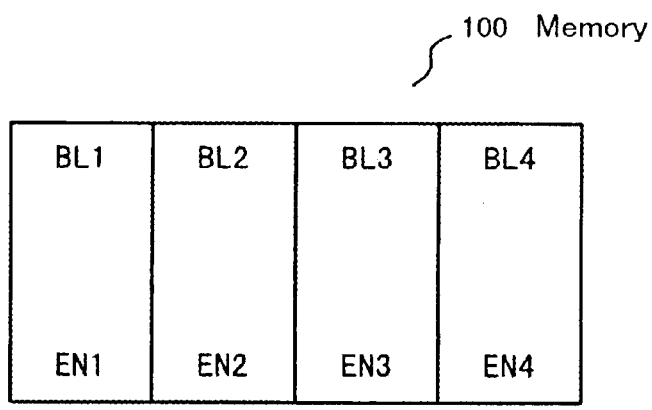
FIG. 5 is a diagram illustrating an example of a plurality of memory blocks and number of erasing stress operations, for the purpose of describing an erasing operation.

FIG. 5 shows an example of a plurality of memory blocks and numbers of erasing stress applications for the purpose of describing an erasing operation. In the example in FIG. 5, a memory 100 is divided into four memory blocks BL1–BL4. EN1–EN4 are the erasing stress values (number of erasing stress applications) that were required in past erasing operations for each memory block, and the magnitude relationship between these erasing stress values is as shown in FIG. 5. Namely, the past erasing stress value EN2 for the memory block BL2 was the longest (highest), and the past erasing stress value EN4 required for memory block BL4 was the smallest. An erasing operation according to an embodiment of the present invention is now described, taking the memory illustrated in FIG. 5 as an example.

Figure 6:
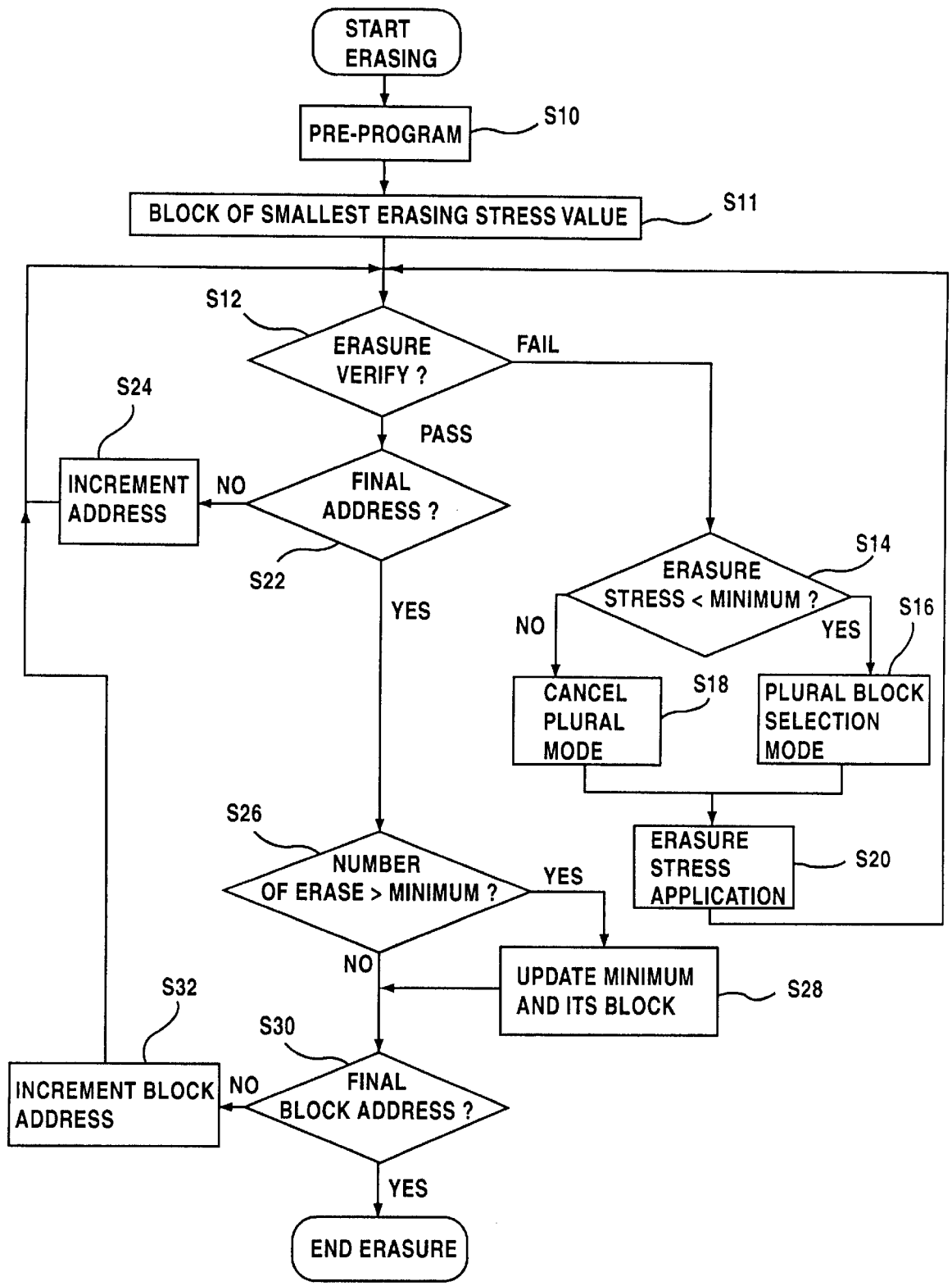
FIG. 6 is a flowchart of an erasing operation according to a first embodiment.

FIG. 6 is a flowchart of an erasing operation according to a first embodiment. FIG. 7 is a table showing an example of an erasing operation according to the first embodiment. FIG. 7 shows the changes in state when the erasing flowchart in FIG. 6 is applied to the memory example illustrated in FIG. 5.

In the first embodiment, the initial erasing stress is applied to four memory blocks simultaneously. Furthermore, the memory block which is the object of the initial erasure verification operation is set as memory block BL4, which has the smallest past erasing stress value (number of applications). Thereupon, whilst applying an erasing stress to the four memory blocks simultaneously, erasure verification is carried out with respect to memory block BL4, which has the lowest erasing stress value, and simultaneous application of the erasing stress is continued until either the number of simultaneous erasing stress applications reaches the minimum value EN4, or all of the memory cells in the memory block BL4 pass the erasure verification. If the number of erasing stress applications reaches the minimum value or if all of the memory cells in memory block BL4 pass erasure verification, the simultaneous application of erasing stress to a plurality of memory blocks is halted, and the operations of applying erasing stress and verifying erasure are carried out for each memory block, individually.

As illustrated in FIG. 6, firstly, pre-programming for programming data 0 into all of the memory blocks subject to erasing is carried out (S10). The memory block BL4 which has the smallest past erasing stress value (number of applications) is set as the object of erasure verification (S11). Namely, the memory block address is set to memory block BL4. Thereupon, erasure verification is implemented to check whether or not the threshold values of the memory cells in the memory block BL4 are lower than the erasure verification level VE (S12). In specific terms, this is carried out by checking whether or not a prescribed current flows in the corresponding bit line when a voltage of the erasure verification level VE is applied to the word line.

Initially, since no erasing stress has been applied, erasure verification will produce a "fail" (not verified) result. Moreover, since the number of erasure stress applications is initially lower than the smallest erasing stress value (S14), a plural block selection mode is assumed (S16), and an erasing stress is applied for a unit time to all four memory blocks simultaneously (S20). Simultaneous application of the erasing stress to all four memory blocks is repeated until the smallest erasing stress value (number of applications) EN4 is reached.

On the other hand, if the memory cell at the first address in memory block BL4 passes the erasure verification (its threshold voltage has become lower than the erasure verification level VE) (S12), then the memory cell address is incremented and the simultaneous application of the erasing stress to a plurality of blocks (S16) is repeated until the final address in that memory block is reached (S22).

Consequently, simultaneous application of erasing stress to the four memory blocks is repeated until either the number of simultaneous applications of the erasing stress to the four memory blocks reaches the minimum value EN4, or the erasure verification operation is completed for all memory cells in memory block BL4 corresponding to the smallest erasing stress value, whichever involves the fewer applications. Therefore, it is possible to avoid over-erasing, even if the erasing stress value for memory block BL4, which has the smallest erasing stress value in the past, declines as illustrated in FIG. 4. Furthermore, if the erasing stress value increases, as shown in FIG. 4, over-erasing can also be avoided, naturally.

In the example shown in FIG. 7, erasure verification is not completed for all the memory cells in the memory block BL4, before the number of erasing stress applications reaches the minimum value EN4 of memory block BL4. Therefore, when the number of erasing stress applications exceeds the minimum value EN4, the operations of applying erasing stress and verifying erasure are carried out for each memory block, individually. In other words, as illustrated at step S18 of the flowchart in FIG. 6, the plural block selection mode is cancelled, and erasing stress is applied to the memory block BL4, which is the object of erasure verification (S20).

In due course, when the threshold values for all the memory cells in the memory block BL4 are less than the erasure verification level VE, the final address is reached (S22) and the block address is incremented (S32). If the number of erasing stresses applied to memory block BL4 is less than the previous minimum value EN4, then the minimum value is updated to the new value. Alternatively, if the number of erasing stress applications for one of the other memory blocks BL1–BL3, which undergo erasure verification subsequently, is less than the previous minimum value EN4 for memory block BL4, then the minimum value and the block having the minimum value are updated accordingly (s26, S28).

As illustrated in FIG. 7, by incrementing the block address, memory block BL1 becomes the object block for the erasing operation. Whilst applying erasing stresses to the memory block BL1 (S20), erasure verification is carried out with respect to the memory cells in the memory block BL1 (S12). When all the memory cells have passed erasure verification, the block address is incremented, and the memory block BL2 then becomes the object block for erasing. Thereafter, the operations of applying erasing stress and verifying erasure are carried out for memory blocks BL2 and BL3, respectively, one block at a time. When erasure verification has been implemented for the final address in the last memory block BL3, the erasing operation is completed.

As described above, according to the first embodiment, in a past erasing operation or an erasing operation in a test prior to product shipment, the erasing stress value (number of applications) for each memory block is stored, and in a subsequent erasing operation, an erasing stress is applied to a plurality of memory blocks simultaneously until the minimum value of these is reached. Alternatively, an erasing stress is applied simultaneously to a plurality of memory blocks until erasure verification is completed for all memory cells of the memory block which corresponds to the minimum value. Thereupon, the operations of applying erasing stress and verifying erasure are carried out for each memory block one by one. Consequently, even if there is a variation between the memory blocks in the erasing stress value required, the probability of over-erasing can be reduced. Furthermore, even if the erasing stress value (number of applications) required for erasure changes, as shown in FIG. 5, it is possible to reduce the possibility of over-erasing. In particular, the erasing characteristics for each memory cell have uniform tendencies, and so there will be a tendency for a memory cell which could be erased by a minimum number of stress applications in the past to be erasable by a minimum number of stress applications in the next erasing operation. Moreover, in the aforementioned embodiment, since the erasing stress is applied to a plurality of memory blocks simultaneously, it is possible to shorten the overall erasing time.

Figure 8:
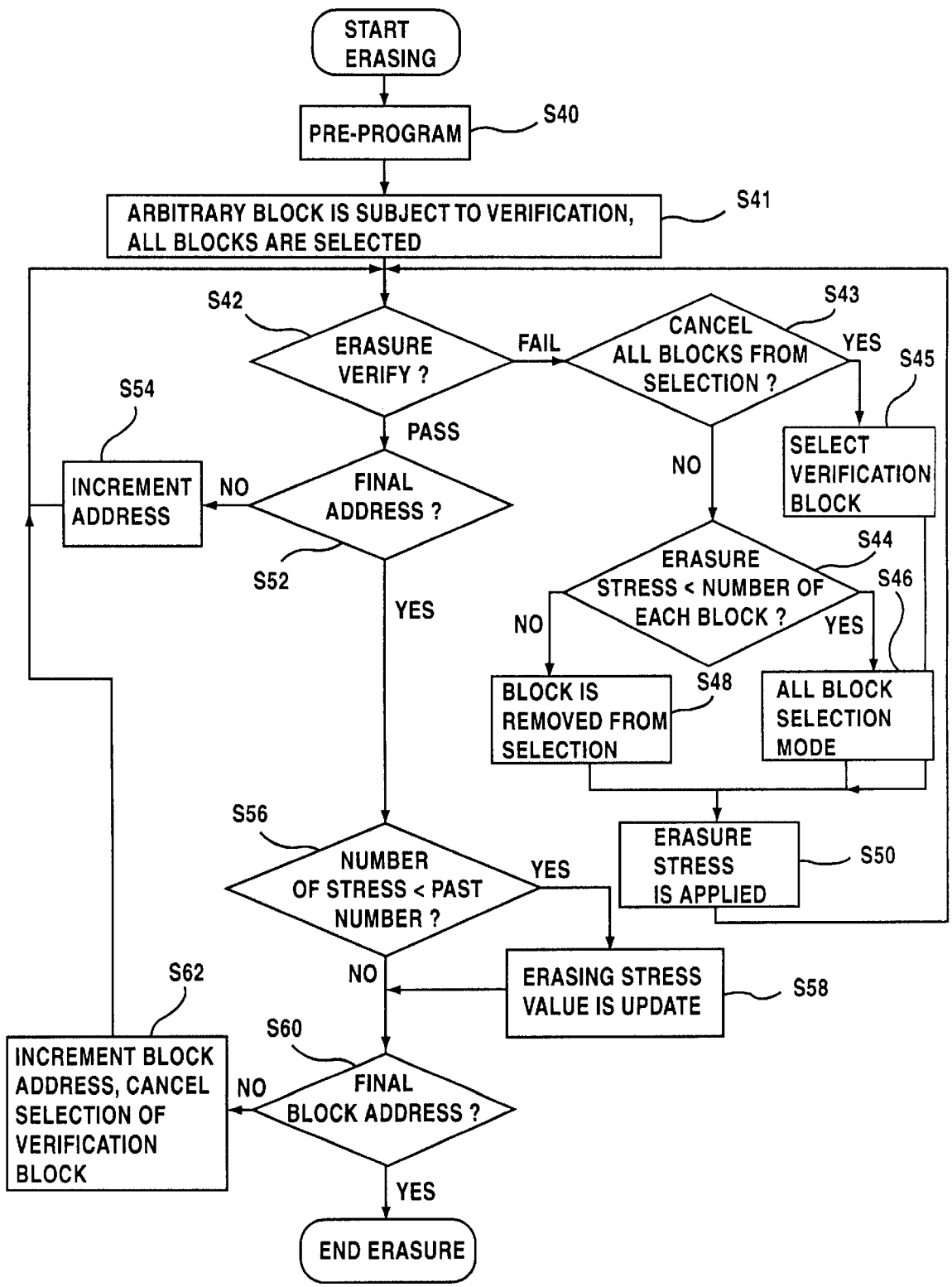
FIG. 8 is a flowchart of an erasing operation according to a second embodiment.

FIG. 8 is a flowchart of an erasing operation according to a second embodiment. FIG. 9 is a table showing an example of an erasing operation according to a second embodiment. FIG. 9 shows changes in state in a case where the erasing flowchart in FIG. 8 is applied to the memory example shown in FIG. 5.

In the second aspect of the embodiment, the erasing stress values (number of applications) in the past for all memory blocks is stored. When erasing, erasing stress is applied simultaneously with other memory blocks, until the past erasing stress values (number of applications) for the respective memory blocks are reached. Therefore, initially the erasing stress is applied to all memory blocks simultaneously, whereupon the memory blocks are removed from the group to which erasing stress is applied simultaneously, in sequence, as they reach their past erasing stress value. Moreover, desirably, the object of erasure verification should start from the memory block having the minimum erasing stress value, as in the first embodiment, but it is possible to start from any memory block. In other words, according to the second embodiment, erasing stress is applied simultaneously to a plurality of memory blocks, giving priority to the past erasing stress values, and when the memory blocks reach their respective past erasing stress values, they are removed from the simultaneous application of erasing stress. Here, by conducting erasure verification from the memory block having the minimum erasing stress value, then if the required erasing stress value (number of applications) tends to decline, as in the first embodiment, it is possible to prevent corresponding over-erasing of the cells. When simultaneous application of erasing stress has ended, the operations of applying erasing stress and verifying erasure are carried for each memory block, individually.

An example where this erasing method is applied to the memory in FIG. 5 is now described with reference to FIGS. 8 and 9. As shown in FIG. 8, initially, pre-programming is carried out with respect to all the memory cells, such that the threshold voltage of all the memory cells is above the program verification level VP (S40). An arbitrary memory block is then taken as the object of erasure verification, and the four memory blocks are taken as the object of erasing stress application (S41). Here, memory block BL1 is taken as the object of erasure verification.

In erasure verification, if the threshold voltages of the memory cells being verified are not lower than the erasure verification level VE (S42), then erasing stress is applied (S50) in a state where plural blocks are selected (S46), until the erasing stress values (number of applications) reach the past erasing stress values for the respective memory blocks. As shown in FIG. 9, from 1 to EN4 erasing stress applications, an erasing stress is applied to the four memory blocks BL1–BL4 simultaneously. When the number of erasing stress applications reaches the past number of applications EN4 for memory block BL4, this is detected at step S44 and the memory block BL4 is removed from the selection (S48). Consequently, the subsequent application of erasing stress is carried out simultaneously for memory blocks BL1, BL2, BL3.

In the example in FIG. 9, in due course, all the memory cells in memory block BL1 pass erasure verification, and it is detected that the address in the block which is the object of erasure verification has reached the final address (S52). If the erasing stress value (number of applications) for memory block BL1 is less than the past number (S56), then this corresponds to the stage where the erasing stress value declines as illustrated in FIG. 4, and the erasing stress value (number of applications) is updated (S58). Thereby, the minimum value is stored at all times. If the final block address has not been reached (S60), the block address is incremented, and the memory block BL2 becomes the object of erasure verification (S62). Moreover, the memory block BL1 for which erasure verification has been completed does not require further application of the erasing stress, so it is removed from the selection (S62).

Consequently, as shown in FIG. 9, the application of erasing stress is carried out simultaneously for memory blocks BL2, BL3, and the object of erasure verification becomes memory block BL2. In the example in FIG. 9, before erasure verification is completed for memory block BL2, it is detected at step S44 that the past erasing stress application number EN3 for memory block BL3 has been reached, and memory block BL3 is released from the selection (S48). Therefore, the application of erasing stress (S50) becomes for memory block BL2 only, and erasure verification is continued for that memory block BL2.

In due course, when the erasure verification for memory block BL2 is completed (S42, S52), memory block BL2 is released from the selection, the block address for the memory block which is the object of erasure verification is incremented, and the memory block BL3 becomes the object of erasure verification (S62).

Thereupon, when it is detected at step S43 that all memory blocks have been released from the selection, the erasing stress is subsequently applied to the memory block which is the object of erasure verification (S45, S50). In other words, the operations of applying erasing stress and verifying erasure are repeated for each memory block, individually, and the memory block which is the object of erasure verification is changed each time erasure verification for one of the memory blocks is completed.

Consequently, similarly to the first embodiment, if the memory block BL4 having the minimum past erasing stress value (number of applications) is taken as the first block subjected to erasure verification, then at the stage where the erasing stress value declines, as shown in FIG. 4, there is an increased probability that erasure verification will be completed before the application of erasing stress to the memory block BL4 reaches the past number of applications EN4. This is desirable, since it enables over-erasing to be prevented.

The erasing circuit 32 which controls the aforementioned erasing operation (see FIG. 1) can be constituted by a simple microcomputer, for example. In other words, it can be realized by a general microcomputer comprising a ROM storing an erasing program based on the erasing flowchart illustrated in FIG. 6 or FIG. 8, and a computing circuit for implementing this program. In this case, the past erasing stress value is stored in a non-volatile memory incorporated within the erasing circuit.

Figure 10:
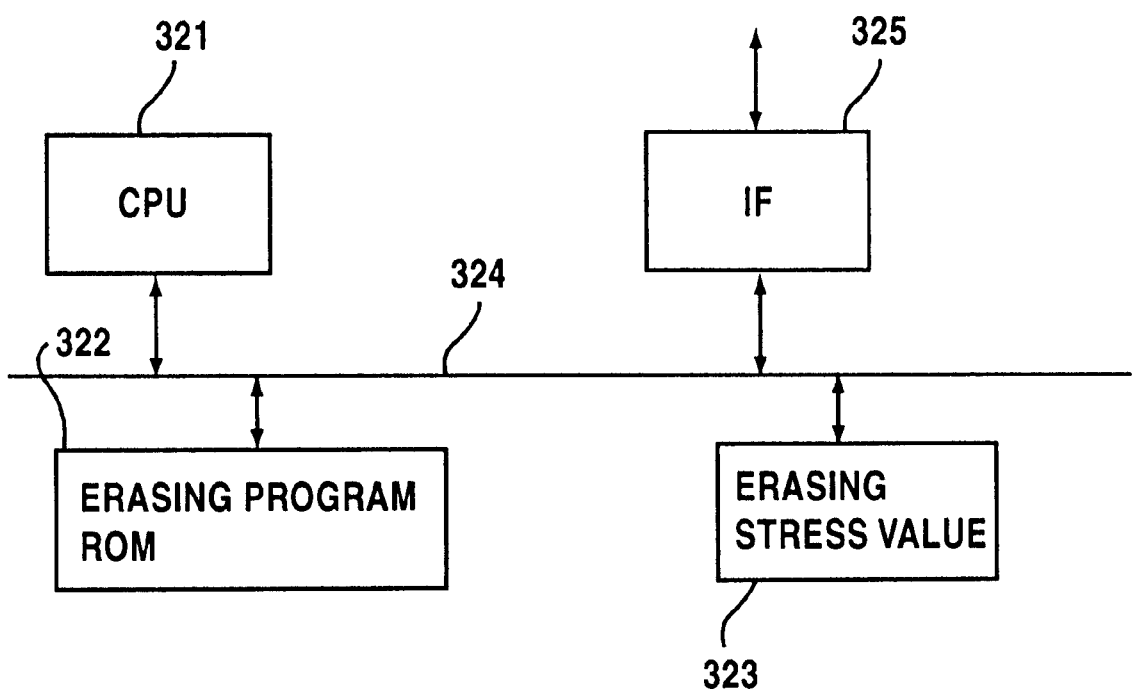
FIG. 10 is a compositional view of an erasing circuit.

FIG. 10 is a compositional diagram of this erasing circuit. In the erasing circuit 32 in FIG. 10, a CPU 321, a ROM 322 storing an erasing program, a non-volatile memory 323 storing erasing stress values, and an interface 325 are connected by means of a bus 324.

In the aforementioned embodiment, the erasing stress value was explained to be a number of times of unit time period for an erasing stress, but the time period for which an erasing stress is applied may also be used. Alternatively, a value incorporating the intensity of the erasing stress may also be used.

As described above, according to the present invention, an erasing stress is applied to a plurality of memory blocks simultaneously on the basis of past erasing stress values, whereupon the operations of applying erasing stress and verifying erasure are repeated for each memory block, individually. Consequently, the probability that over-erasing will occur can be reduced to a low probability, whilst the time taken for the whole erasing operation can be shortened.

What is claimed is:

1. A non-volatile memory device, in which programming or erasing of memory cells is carried out by injecting or removing carriers in floating gates in the memory cells, comprising:

a plurality of memory blocks each comprising a plurality of memory cells, respectively; and an erasing circuit for applying an erasing stress in units of said memory blocks and verifying that erasure has been completed in units of memory cells;

wherein said erasing circuit applies an erasing stress to said plurality of memory blocks simultaneously until a past erasing stress minimum value for said plurality of memory blocks.

2. A non-volatile memory device, in which programming or erasing of memory cells is carried out by injecting or removing carriers in floating gates in the memory cells, comprising:

a plurality of memory blocks each comprising a plurality of memory cells, respectively; and an erasing circuit for applying an erasing stress in units of said memory blocks and verifying that erasure has been completed in units of memory cells;

wherein said erasing circuit applies an erasing stress to said plurality of memory blocks simultaneously until a past erasing stress minimum value for said plurality of memory blocks, whereupon it applies erasing stress and verifies complete erasure for each of said memory blocks, individually.

3. A non-volatile memory device, in which programming or erasing of memory cells is carried out by injecting or removing carriers in floating gates in the memory cells, comprising:

a plurality of memory blocks each comprising a plurality of memory cells, respectively; and an erasing circuit for applying an erasing stress in units of said memory blocks and verifying that erasure has been completed in units of memory cells;

wherein said erasing circuit applies an erasing stress to said plurality of memory blocks simultaneously until a past erasing stress minimum value for said plurality of memory blocks, or until complete erasure has been verified for all memory cells in the memory block corresponding to said erasing stress minimum value, whereupon it applies erasing stress and verifies complete erasure for each of said memory blocks, individually.

4. The non-volatile memory according to claim 3, wherein:

said erasing circuit updates the erasing stress minimum value, when erasure of the memory block corresponding to said erasing stress minimum value is completed at a smaller erasing stress value than the past erasing stress minimum value.

5. A non-volatile memory device, in which programming or erasing of memory cells is carried out by injecting or removing carriers in floating gates in the memory cells, comprising:

a plurality of memory blocks each comprising a plurality of memory cells, respectively; and an erasing circuit for applying an erasing stress in units of said memory blocks and verifying that erasure has been completed in units of memory cells;

wherein, whilst said erasing circuit applies an erasing stress respectively to said plurality of memory blocks until their past erasing stress values, the application of erasing stress to a first memory block, in which said complete erasure verification has been carried out for all memory cells, is finished, further the application of erasing stress to a second memory block which has reached said past erasing stress value is halted temporarily, and application of erasing stress and verification of complete erasure are carried out for each memory block, individually, with respect to said second memory block.

6. The non-volatile memory device according to claim 5, wherein:

said erasing circuit updates the erasing stress value for a memory block, when erasure for said memory block is completed at a smaller erasing stress value than the corresponding past erasing stress value.

7. The non-volatile memory device according to any one of claims 1 to 6, wherein:

said erasing stress value is the number of times that a prescribed unit period of erasing stress is applied.

8. The non-volatile memory device according to any one of claims 1 to 6, wherein:

said memory cell comprises a control gate connected to a word line, a drain connected to a bit line and a source connected to a source line, and said erasing circuit applies said erasing stress by applying an electric field between said control gate and source.

* * * * *